United States Patent [19]
Larson et al.

[11] Patent Number: 5,206,788
[45] Date of Patent: Apr. 27, 1993

[54] SERIES FERROELECTRIC CAPACITOR STRUCTURE FOR MONOLITHIC INTEGRATED CIRCUITS AND METHOD

[75] Inventors: William Larson; Thomas Davenport; Constance DeSmith, all of Colorado Springs, Colo.

[73] Assignee: Ramtron Corporation, Colorado Springs, Colo.

[21] Appl. No.: 806,726

[22] Filed: Dec. 12, 1991

[51] Int. Cl.⁵ .................. H01G 1/01; H01L 3/00; H01L 27/02
[52] U.S. Cl. .................. 361/313; 29/25.42; 257/295
[58] Field of Search .......... 29/25.42; 361/311-313, 361/320, 321, 328, 329, 330; 357/51; 365/145

[56] References Cited

U.S. PATENT DOCUMENTS

| | | | |
|---|---|---|---|
| 3,267,342 | 8/1966 | Pratt et al. | 361/311 |
| 3,569,802 | 3/1971 | Brauer et al. | 361/321 |
| 4,135,224 | 1/1979 | Maher | 361/321 |
| 4,267,634 | 5/1981 | Wellard | 29/620 |
| 4,437,139 | 3/1984 | Howard | 361/313 |
| 4,914,546 | 4/1990 | Alter | 361/313 |
| 5,005,102 | 4/1991 | Larson | 361/313 |
| 5,046,043 | 9/1991 | Miller et al. | 365/145 |

Primary Examiner—Donald A. Griffin
Attorney, Agent, or Firm—Edward D. Manzo; Mark J. Murphy

[57] ABSTRACT

A ferroelectric capacitor for a memory device including a substrate, a bottom electrode and a top electrode. Between the bottom and top electrodes is either an alternating plurality of layers of ferroelectric material and intermediate electrodes or a plurality of layers of ferroelectric material. A method for forming the same through establishing one layer over the other is also disclosed.

30 Claims, 4 Drawing Sheets

SERIES FERROELECTRIC CAPACITOR STRUCTURE FOR MONOLITHIC INTEGRATED CIRCUITS AND METHOD

BACKGROUND OF THE INVENTION

The present invention is directed to a ferroelectric capacitor and method for forming the same.

The current method for producing ferroelectric capacitors for integrated ferroelectric memories involves depositing a single layer of a ferroelectric/dielectric material between a bottom electrode and a top electrode. See U.S. Pat. Nos. 4,918,654 ("SRAM With Programmable Capacitance Divider") and U.S. Pat. No. 5,005,102 ("Multilayer Electrodes For Integrated Circuit Capacitors") assigned to Ramtron Corporation, the assignee of the present invention. The result is a capacitor having a bottom electrode, a single layer of ferroelectric material, and a top electrode. A problem with this configuration is that if a defect is somehow introduced to either the bottom electrode or the ferroelectric layer, such as during the deposition process or during subsequent processing, the defect may propagate through the entire structure. A defect propagates as either the bottom electrode or ferroelectric layer is deposited or as the ferroelectric layer is annealed and undergoes a phase transformation.

A defect can cause an electrical short between the top and bottom electrodes and thereby render the capacitor useless. Furthermore, the existence of such a defect in the capacitor can lead to instability in the electrical properties of the capacitor, for example in the breakdown voltage, leakage current, and dielectric constant. Hence, such a defect will cause the electrical properties of the capacitor to be degraded.

A defect such as described above is a frequent occurrence in the capacitor production process. In fact, unwanted defects are typically the single largest yield limiter in the production process. As a result, manufacturing yield is decreased which affects the product manufacturing costs. Therefore, defects cause a great deal of wasted time, effort, and money for a manufacturer.

In commercial integrated circuit memory devices, a large number of capacitors are fabricated and incorporated into each device. In order for the memory device to operate properly, each capacitor must possess good electrical characteristics. Therefore, a random defect, which degrades the electrical performance of one capacitor, will also degrade the electrical performance of the memory device and result in a defective memory device. Accordingly, the probability of making a good memory device is greatly dependent on the effect of these random defects.

The object of the present invention is to provide a ferroelectric capacitor which decreases the probability of a random defect impacting the quality of the ferroelectric memory device.

SUMMARY OF THE INVENTION

The present invention in one of its aspects is directed to a ferroelectric capacitor for use in volatile and nonvolatile ferroelectric memories. The present invention is intended to prevent a random defect from propagating throughout the entire structure of a memory device. The capacitor of the present invention achieves this by having a series of ferroelectric/dielectric and intermediate electrode layers established sequentially on a bottom electrode. A top layer is then established over the series of ferroelectric layers.

In another embodiment, a series of ferroelectric/dielectric layers is established on a bottom electrode, and a top electrode is established over those layers.

The total thickness of the dielectric layers will be equal to the thickness of the dielectric of the prior art single dielectric layer capacitor. Therefore, the capacitor of the present invention will have a similar size and similar electrical characteristics as the prior art capacitor.

However, the capacitor of the present invention has two major advantages over the prior art devices. First, a random defect occurring in any one of the ferroelectric/dielectric layers is less likely to propagate throughout the entire capacitor structure. These defects usually occur during the depositing of a layer. Therefore, by alternately deposited the layers, i.e. electrode/dielectric/electrode/dielectric, etc., as in the present invention, defects are confined to a single dielectric layer. Accordingly, since the structure of the present invention comprises a plurality of dielectric layers separated by intermediate electrodes, a randomly occurring defect in only one of the dielectric layers is less likely to cause a catastrophic failure of the device. As a result, a more robust capacitor with a lower probability of failing as a result of a random defect is achieved.

Second, as the number of series combinations increases to form the composite capacitor, the ratio of the dielectric thickness compared to the grain size of the dielectric increases. This provides a means to modify the electrical characteristics of the capacitor since the ratio of the grain boundary to electrode interface parasitic effects will change.

The present invention is further directed to a method for fabricating the ferroelectric capacitor of the present invention. In general, the method comprises a sequence of deposition steps followed by annealing and defining the structure to form a ferroelectric capacitor having either a series of ferroelectric/dielectric and intermediate electrode layers, or a series of only ferroelectric/dielectric layers.

Considering the method of the present invention in one of its embodiments, the top electrode of the capacitor is defined first, then the dielectric/ferroelectric layers, and finally the bottom electrode.

In still a further embodiment of the invented method, the top electrode and the dielectric/ferroelectric layers are defined simultaneously so that they are coincident. The bottom electrode is then defined in a separate step.

In another aspect, annealing is done after all the ferroelectric/dielectric layers are established. In another embodiment, annealing is done after each layer of ferroelectric/dielectric material is established.

BRIEF DESCRIPTION OF THE DRAWINGS

In describing the preferred embodiment, reference is made to the accompanying drawings wherein like parts have like reference numerals, and wherein.

DETAILED DESCRIPTION OF THE PRESENTLY PREFERRED EMBODIMENTS

Figure 1:
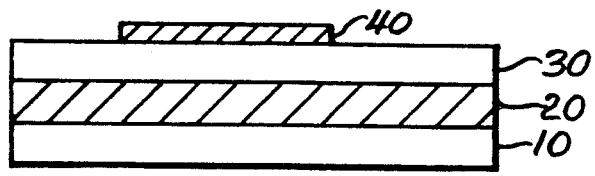
FIG. 1 is a cross-sectional view of a ferroelectric capacitor produced by the prior method.

FIG. 1 shows a cross-sectional view of the structure produced by the current method for fabricating ferroelectric capacitors for integrated ferroelectric memories. In this structure, a substrate 10 is provided. Over it is a bottom electrode or "plate" 20. A single layer of ferroelectric/dielectric material 3 is deposited between the bottom electrode 20 and a top electrode 40. As stated previously, a defect in the bottom electrode or the ferroelectric/dielectric layer can easily propagate throughout the structure, resulting in degraded electrical properties in the capacitor and severely limiting the electrical capability of any memory device the capacitor is incorporated within.

The ferroelectric capacitor of the present invention is intended to decrease the probability of a random defect affecting the quality of the capacitor of a memory device in which the capacitor is incorporated. The present invention is illustrated by six embodiments. The six embodiments, illustrated in the drawings, are described below with reference to a method for fabricating each embodiment.

Figure 2:
FIG. 2 is a cross-sectional view of a portion of a ferroelectric capacitor showing a bottom electrode over a substrate.

Generally, in FIG. 2, in accordance with the present invention, a bottom layer or electrode 20 is established over a substrate 10. The substrate can be comprised of any basic material, such as silicon and silicon dioxide, germanium, gallium arsenide for example, as long as there is not a material mismatch between substrate 10 and bottom electrode 20. Substrate 10 can be fabricated by thermal oxidation or chemical vapor deposition (CVD), for example. The bottom electrode can be established, for example, by deposition or other commonly used techniques. For example, sputtering deposition or molecular beam epitaxy (MBE) may be used. Bottom electrode 20 preferably comprises platinum (Pt), palladium (Pd), or an alloy of these two materials, and it has a thickness in the range from 500 Å (50 nm) to 5,000 Å (500 nm).

One of the embodiments of the present invention is then established over the bottom electrode structure.

FIRST EMBODIMENT

Figure 3A:
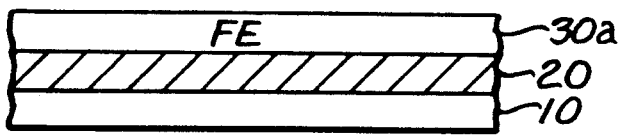
FIG. 3a is a cross-sectional view of a portion of the first embodiment of the present invention showing ferroelectric material over the structure of FIG. 2.

The method for fabricating the first embodiment of the present invention is shown in FIGS. 3a-3g. In this method, a dielectric, such as a ferroelectric material 30a, is established over bottom electrode 20, as shown in FIG. 3a. Ferroelectric material 30a can be established by a number of different methods. For example, the material can be deposited by sputtering, evaporation, or chemical vapor deposition (CVD), or a spin-on method such as sol-gel or metal-organic decomposition (MOD). The composition of the ferroelectric material is preferably a lead zirconate titanate composition having the chemical composition of $Pb(Ti_xZr_{1-x})O_3$, wherein x is in the range from 0.2 to 1.0. Further, the ferroelectric material can be doped with, for example, niobium (Nb) or lanthanum (La) in the range of 0.5% to 5.0%, atomic percentage.

Figure 3B:
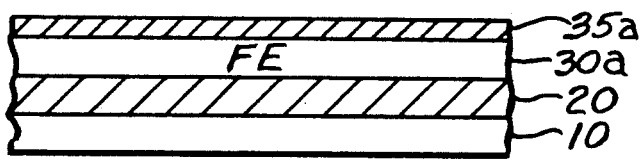
FIG. 3b shows the structure of FIG. 3a with an intermediate electrode over the ferroelectric material.

After ferroelectric material 30a has been established, an intermediate electrode 35a is established over ferroelectric material 30a as shown in FIG. 3b. Intermediate electrode 35a is preferably established in a manner similar to that used for bottom electrode 20 and can be comprised of a similar material. The preferred thickness of layer 35a is in the range of 50 Å (5 nm) to 1000 Å (100 nm).

Figure 3C:
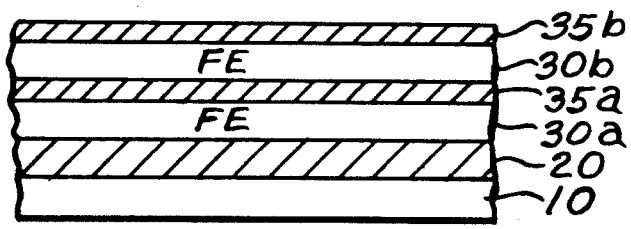
FIG. 3c shows the structure of FIG. 3b with ferroelectric material over the intermediate electrode and another intermediate electrode over the ferroelectric material.

Thereafter, the process of establishing a layer of ferroelectric material and another intermediate electrode is repeated until the desired number of layers is obtained. These layers can be established in a manner and with material similar to that used in layers 30a and 35a. FIG. 3c shows an example of this structure with one additional layer of ferroelectric material 30b and one additional intermediate electrode 35b.

Figure 3D:
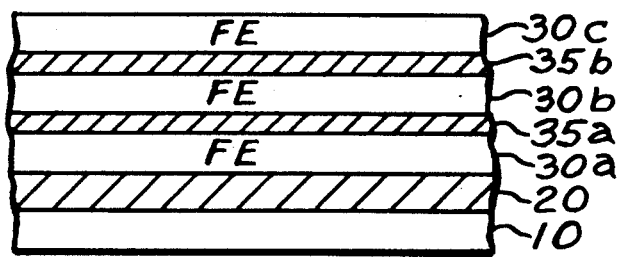
FIG. 3d shows the structure of FIG. 3c with further ferroelectric material over the already established layers of ferroelectric material and intermediate electrodes.

A further layer of ferroelectric material 30c is then established over the other ferroelectric layers 30a, 30b and the intermediate electrodes 35a, 35b, as shown in FIG. 3d. Layer 30c can be established in a manner similar to that used for layer 30a.

The entire structure is then annealed to form the proper ferroelectric phase. Annealing may be performed, for example, by a rapid thermal anneal (RTA) or by furnace annealing. The ambient used for the annealing is, for example oxygen, oxygen-argon, or oxygen-nitrogen mixtures at a temperature in the range of 500° C. to 900° C. Preferably, a furnace anneal in 100% oxygen for 30 to 90 minutes is done. The anneal is performed to convert the deposited dielectric into a material with ferroelectric characteristics.

Figure 3E:
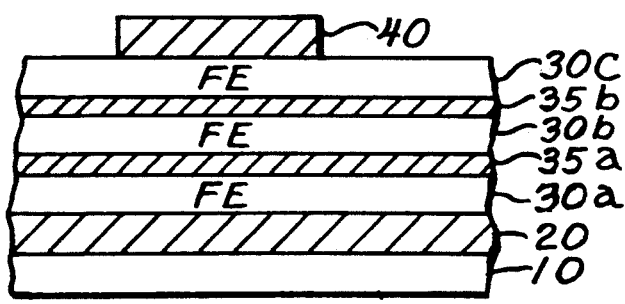
FIG. 3e shows the structure of FIG. 3d with a top electrode over the further ferroelectric material.

A top electrode 40 is then established over layer 30c. The top electrode can be established, for example, by deposition using the same method and material as used in bottom electrode 20. Top electrode 40 is then defined. Electrode 40 may be defined by conventional semiconductor fabrication techniques such as photolithography and plasma, for example. Preferably, the thickness of top electrode 40 is in the range from 500 Å (50 nm) to 5,000 Å (500 nm). The resulting structure is shown in FIG. 3e.

The capacitor stack, comprising ferroelectric layers 30a, 30b, 30c and intermediate electrodes 35a, 35b, is then defined. The capacitor stack may, for example be defined by plasma etching or other aniostropic etch processes.

Figure 3F:
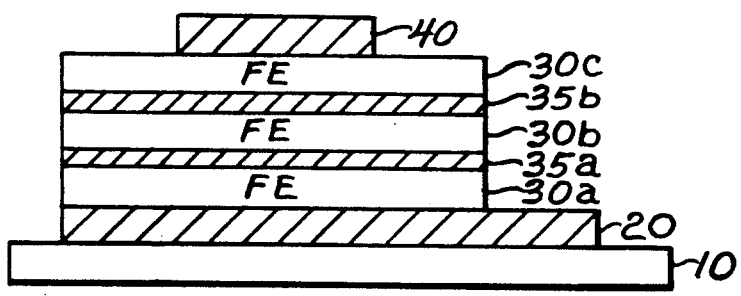
FIG. 3f shows the structure of FIG. 3e after it has been defined.

Bottom electrode 20 is then defined, for example by plasma etching. Preferably, bottom electrode 20 is larger in at least one transverse direction than the capacitor stack. This relationship exists so that subsequent contact may be made from other circuits or elements to bottom electrode 20. FIG. 3f shows the resulting structure.

Figure 3G:
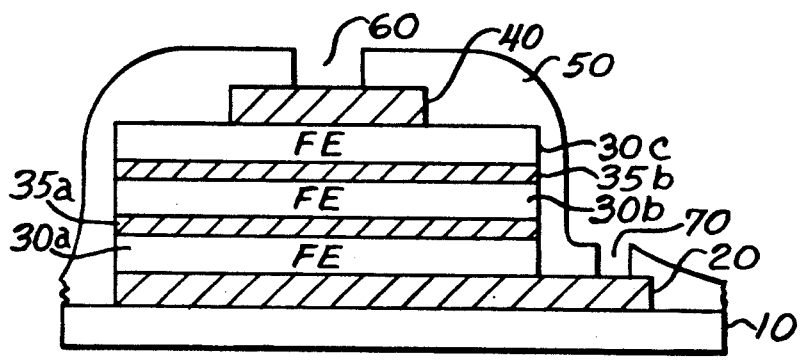
FIG. 3g shows a cross-sectional view of the completed structure of the first embodiment.

In FIG. 3g, a dielectric material 50 is then established over the structure in order to passivate the edge of the capacitor stack. Dielectric material 50 can be, for example, silicon dioxide or silicon nitride. Dielectric material 50 can be established, for example, by deposition such as by CVD. Dielectric material 50 is used to minimize the leakage current of the capacitor. Contact windows 60, 70 are then defined through dielectric material 50 to top electrode 40 and bottom electrode 20, respectively. Contact window 60, 70 can be defined by conventional photopatterning and etching. FIG. 3g illustrates the completed structure of the first embodiment of the present invention, it being understood that contacts are to be added.

SECOND EMBODIMENT

The method for fabricating the second embodiment of the present invention includes all the steps in the method for fabricating the first embodiment. However, in the method for fabricating the second embodiment, we anneal after establishing each layer of ferroelectric material, instead of annealing the structure only after establishing the last layer of ferroelectric material (i.e. 30c in FIG. 3d), as in the first embodiment. Accordingly, the diffusion of active species, such as oxygen and lead oxide, in the second embodiment can occur from the top surface of each layer as it is annealed. This provides a much greater opportunity for diffusion than in the first embodiment wherein any diffusion must occur through the edges of the ferroelectric layers. Preferably, each anneal is a furnace anneal at a temperature between 500° C. to 800° C. for 30 to 90 minutes.

The preferred embodiment of the present invention is produced utilizing this method and comprises a capacitor stack having alternating ferroelectric layers and intermediate electrodes preferably with two to four ferroelectric layers.

THIRD EMBODIMENT

The method for fabricating the third embodiment of the present invention involves the same steps as were described above, referring to FIGS. 3a–3d, for the method for fabricating the first embodiment. For example, after ferroelectric layer 30c is established, the structure is annealed, and top electrode 40 is then established in a manner similar to that described above in the method for the first embodiment. However, unlike in the method for fabricating the first embodiment, in this method the top electrode is not defined at this point in time. Rather, top electrode 40 is defined later—simultaneously with defining the capacitor stack. As a result, the capacitor structure and the top electrode are congruent (coincident) in plan view (See FIG. 8). Accordingly, one fewer definition step is necessary than in the method for fabricating the first embodiment. Therefore, the manufacturing cost for fabricating this embodiment is less than the cost for fabricating the first embodiment. Unfortunately, this embodiment has a disadvantage in that there is an increased sensitivity to leakage and breakdown at the edges which can cause a higher leakage current or lower breakdown voltage.

Figure 4A:
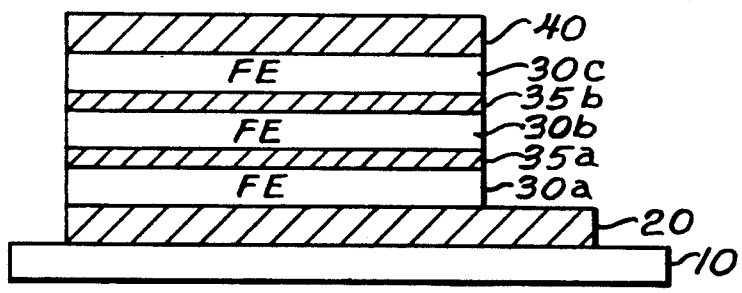
FIG. 4a shows a cross-sectional view of a portion of the third embodiment of the present invention wherein the top and intermediate electrodes and the ferroelectric material are coincident.

After defining the edges of layers 30a, 35a, 30b, 35b, 30c, and 40, the bottom electrode 20 is then defined as described above in the method for fabricating the first embodiment. Electrode 20 is larger in plan view in at least one dimension then the stack above it (See FIG. 8). FIG. 4a shows the resulting structure.

Figure 4B:
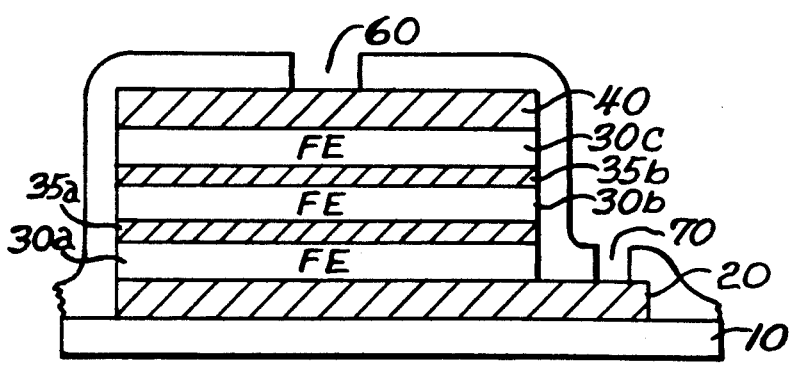
FIG. 4b shows a cross-sectional view of the completed structure of the third embodiment of the present invention.

Next, dielectric material 50 is established and windows 60, 70 are defined in a manner similar to that described for the first embodiment. FIG. 4b shows the completed structure for the third embodiment of the present invention.

FOURTH EMBODIMENT

The method for fabricating this embodiment includes all the steps of the method for fabricating the third embodiment of the present invention (FIGS. 4a, 4b). However, as described in the method for fabricating the second embodiment, in the fabrication of this embodiment, we anneal not only after we establish the last (uppermost) ferroelectric layer but also after we establish each ferroelectric layer.

As a result, the structure shown in FIG. 4b is formed but has the advantage in that there has been a greater opportunity for diffusion of active species than in the third embodiment. Accordingly, the capacitor of the fourth embodiment is more robust than the capacitor of the third embodiment.

FIFTH EMBODIMENT

The method for fabricating the fifth embodiment involves FIGS. 5a–5d and employs the same steps as shown in FIG. 3a for fabricating the first embodiment wherein ferroelectric material 30a is established over bottom electrode 20. The structure is then annealed. The annealing can be done using a silicon diffusion furnace system, for example.

Figure 5A:
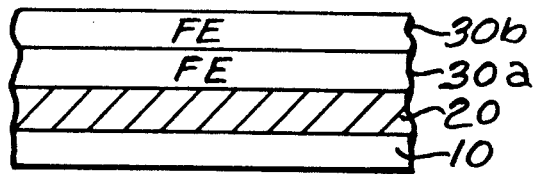
FIG. 5a is a cross-sectional view of a portion of the fifth embodiment of the present invention.

A layer of ferroelectric material 30b is then established directly over and upon the upper surface of ferroelectric material 30a, as shown in FIG. 5a. Layer 30b can be established, for example, using the same material and in the same manner as ferroelectric material 30a. The structure is then annealed, for example, in a manner similar to that used after the establishment of ferroelectric material 30a.

Figure 5B:
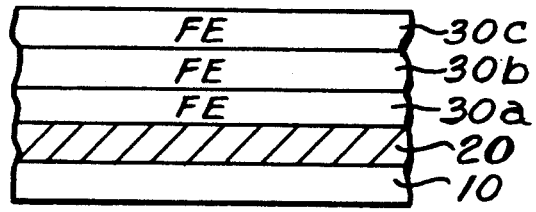
FIG. 5b shows a cross-sectional view of the structure of FIG. 5a with layers of ferroelectric material over the bottom electrode.
Figure 5C:
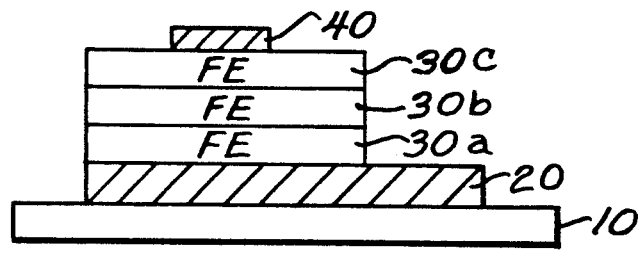
FIG. 5c shows structure of FIG. 5b with the addition of a top electrode.

Still another layer of ferroelectric material 30c can be established directly over and upon the upper surface of ferroelectric material 30b, for example, with materials and in a manner similar to that used for ferroelectric material 30a. FIG. 5b shows the resulting structure. The structure is then annealed, for example, in a manner similar to that used after the establishment of ferroelectric material 30a. Layers of ferroelectric material can be continually established and annealed until the required total dielectric thickness is reached. This method of fabrication is advantageous over the methods for fabricating the first through fourth embodiment because in this embodiment there ar fewer electrode-dielectric interfaces which entail more difficult manufacturing issues. Therefore, this method of fabrication has easier manufacturing and process control than in the fabrication methods for the first through fourth embodiments.

A top electrode 40 is then established and defined, for example, as described in the method for fabricating the first embodiment. Layers of ferroelectric material 30a, 30b, 30c are then defined, for example, in a manner similar to that disclosed in the method for fabricating the first embodiment. Bottom electrode 20 is then defined, as described in the first embodiment. The structure shown in FIG. 5c results.

Figure 5D:
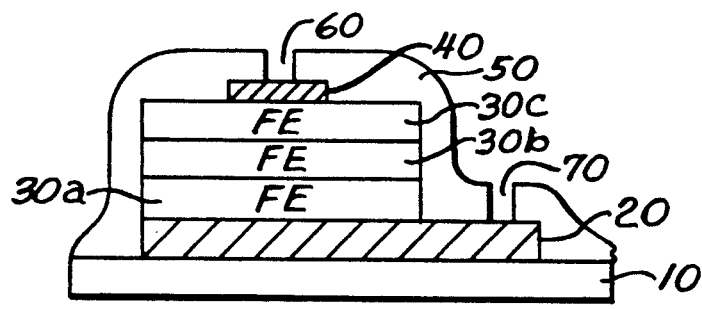
FIG. 5d shows a cross-sectional view of the completed structure of the fifth embodiment.

A dielectric material 50 is then established, as described in the method for fabricating the first embodiment, and contact windows 60, 70 are opened, as previously described. The completed structure for the capacitor of the fifth embodiment is shown in FIG. 5d.

SIXTH EMBODIMENT

Figure 6A:
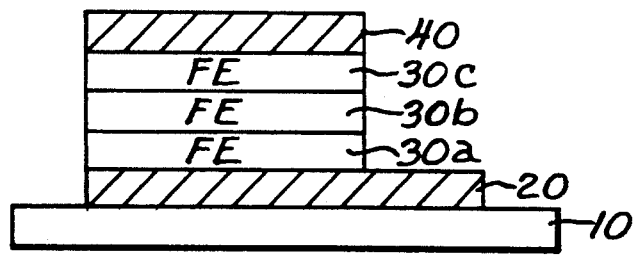
FIG. 6a shows a cross-sectional view of a portion of the structure of the sixth embodiment of the present invention.

The method for fabrication of the sixth embodiment of the present invention involves the same steps as were previously described in FIGS. 5a-5b for fabricating the fifth embodiment. In this method of fabrication, annealing is delayed until all the ferroelectric layers have been established. Top electrode 40 is then established, for example, in the same manner as in the fabrication of the fifth embodiment, but it is not defined at this time. Rather, top electrode 40 is defined when the capacitor stack (i.e. layers 30a, 30b, 30c of ferroelectric material) is defined. As a result, the capacitor stack and the top electrode are coincident (See FIG. 8). The stack can be defined, for example, in the same manner as used in the method for fabrication of the fifth embodiment. Bottom electrode 20 is then defined. The structure shown in FIG. 6a results.

Figure 6B:
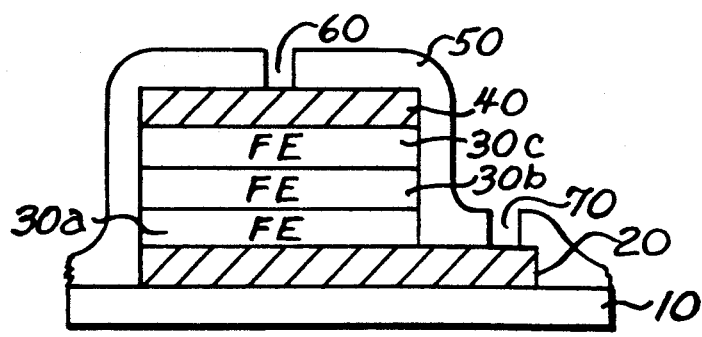
FIG. 6b shows a cross-sectional view of the completed structure of the sixth embodiment of the present invention.

Next, dielectric material 50 is established and contact windows 60, 70 are defined, as explained in the fabrication of the first embodiment. FIG. 6b shows the completed structure of the capacitor of the sixth embodiment of the present invention.

Figure 7:
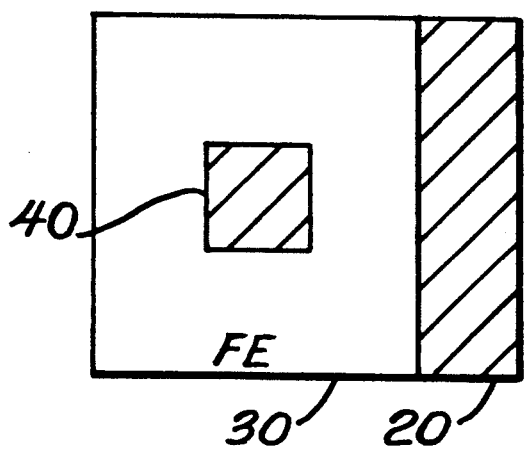
FIG. 7 shows a plan view of the structure of the first, second and fifth embodiments of the present invention after the top electrode has been established and defined but before the dielectric has been established.

FIG. 7 shows a plan view of the structure of the first, second and fifth embodiments after top electrode 40 has been established and defined but prior to the establishment of dielectric 50.

Figure 8:
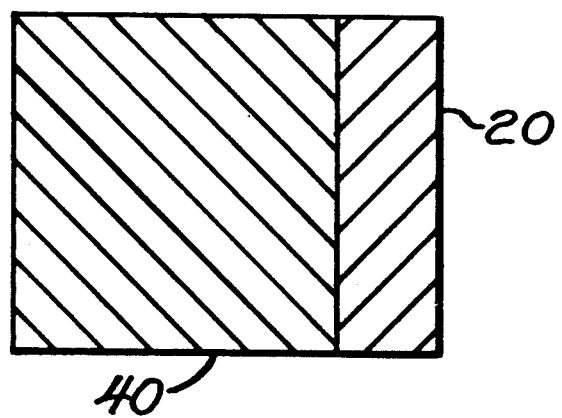
FIG. 8 shows a plan view of the structure of the third, fourth and sixth embodiments of the present invention after the top electrode has been established and defined but before the dielectric has been established.

FIG. 8 shows a plan view of the structure of the third, fourth and sixth embodiments after top electrode 40 has been established and defined but prior to the establishment of dielectric 50.

Once the capacitor of the present invention has been fabricated, it can be incorporated into a memory device or an array of capacitors.

This description has been offered for illustrative purposes only and is not intended to limit the invention of this application, which is defined in the claims below. The present invention is not dependent on any particular substrate material.

We claim:

1. A ferroelectric capacitor comprising:
a substrate;
a bottom electrode over said substrate;
a first layer of a ferroelectric material over said bottom electrode;
an intermediate electrode over said first layer of ferroelectric material;
a second layer, distinct from said first layer, of ferroelectric material, said second layer being located over said intermediate electrode; and
a top electrode over said second ferroelectric material.

2. The capacitor of claim 1 wherein said top electrode, said ferroelectric material and said intermediate electrode have lateral edges which are coincident.

3. The capacitor of claim 1 wherein said ferroelectric material comprises a lead zirconate titanate composition defined by the chemical composition $Pb(Ti_xZr_{1-x})O_3$, wherein x is from 0.2 to 1.0.

4. The capacitor of claim 3 wherein said ferroelectric material further comprises a dopant.

5. The capacitor of claim 4 wherein said dopant is selected from the group comprising niobium and lanthanum and is in a range of 0.5% to 5.0% atomic percentage.

6. The capacitor of claim 1 wherein said intermediate electrode is selected from the group comprising platinum, palladium and an alloy of platinum and palladium.

7. The capacitor of claim 1 wherein a dielectric material is established over said capacitor and contact windows are defined to said top electrode and said bottom electrode.

8. A ferroelectric capacitor comprising:
a substrate;
a bottom electrode over said substrate;
an alternating plurality of distinct layers of ferroelectric material and intermediate electrodes located over said bottom electrode;
another layer, distinct from said layers of ferroelectric material, of ferroelectric material, said another layer being located over said alternating plurality of layers; and
a top electrode over said another layer of ferroelectric material.

9. The capacitor of claim 8 wherein said top electrode, said ferroelectric material and said intermediate electrode have lateral edges which are coincident.

10. The capacitor of claim 8 wherein said ferroelectric material comprises a lead zirconate titanate composition defined by the chemical composition $Pb(Ti_xZr_{1-x})O_3$, wherein x is from 0.2 to 1.0.

11. The capacitor of claim 10 wherein said ferroelectric material further comprises a dopant.

12. The capacitor of claim 11 wherein said dopant is selected from the group comprising niobium and lanthanum and is in a range of 0.5% to 5.0% atomic percentage.

13. The capacitor of claim 8 wherein said intermediate electrode is selected from the group comprising platinum, palladium and an alloy of platinum and palladium.

14. The capacitor of claim 8 wherein a dielectric material is established over said capacitor and contact windows are defined to said top electrode and said bottom electrode.

15. A ferroelectric capacitor comprising:
a substrate;
a bottom electrode over said substrate;
a plurality of layers of ferroelectric material over said bottom electrode, each of said plurality of layers located directly over each other; and
a top electrode over said plurality of layers of ferroelectric material.

16. The capacitor of claim 15 wherein said ferroelectric material comprises a lead zirconate titanate composition defined by the chemical composition $Pb(Ti_xZr_{1-x})O_3$, wherein x is from 0.2 to 1.0.

17. The capacitor of claim 16 wherein said ferroelectric material further comprises a dopant.

18. The capacitor of claim 17 wherein said dopant is selected from the group comprising niobium and lanthanum and is in a range of 0.5% to 5.0% atomic percentage.

19. The capacitor of claim 15 wherein a dielectric material is established over said capacitor and contact windows are defined to said top electrode and said bottom electrode.

20. A method for forming a ferroelectric capacitor comprising the steps of:
    forming a substrate;
    establishing a bottom electrode over said substrate;
    establishing a first layer of ferroelectric material over said bottom electrode;
    establishing an intermediate electrode over said layer of ferroelectric material;
    establishing a second layer of ferroelectric material, distinct from said first layer, over said intermediate electrode; and
    establishing a top electrode over said second layer of ferroelectric material.

21. The method of claim 20 wherein first the top electrode is defined, then the layers of ferroelectric material and intermediate electrode are defined, and then the bottom electrode is defined so that at least one edge of the bottom electrode is unobstructed.

22. The method claim 20 including the step of annealing after the second layer of ferroelectric material is established.

23. The method of claim 20 including the step of annealing after each layer of ferroelectric material and intermediate electrode is established.

24. The method of claim 20 wherein the top electrode, the ferroelectric material and the intermediate electrode are all defined at the same time so that the edges of each are coincident.

25. The method of claim 20 including the step of establishing a dielectric material over said capacitor and defining contact windows through said dielectric material to said top electrode and said bottom electrode.

26. A method for forming a ferroelectric capacitor comprising the steps of:
    forming a substrate;
    establishing a bottom electrode over said substrate;
    establishing a plurality of layers of ferroelectric material over said bottom electrode, each of said plurality of layers being located directly over one another; and
    establishing a top electrode over said layers of ferroelectric material.

27. The method of claim 26 wherein first the top electrode is defined, then the layers of ferroelectric material are defined, and then the bottom electrode is defined so that at least one edge of the bottom electrode is unobstructed.

28. The method of claim 26 wherein the top electrode and layers of ferroelectric material are defined at the same time so that the edges of each layer are coincident.

29. The method of claim 26 including the step of annealing after said plurality of layers of ferroelectric material have been established.

30. The method of claim 26 including the step of annealing after each layer of ferroelectric material is established.

* * * * *